US009437558B2

(12) United States Patent
Pye et al.

(10) Patent No.: US 9,437,558 B2
(45) Date of Patent: Sep. 6, 2016

(54) HIGH FREQUENCY INTEGRATED CIRCUIT AND PACKAGING FOR SAME

(71) Applicant: ANALOG DEVICES, INC., Norwood, MA (US)

(72) Inventors: Andrew Pye, Somerville, CA (US); Rodrigo Carrillo-Ramirez, Chelmsford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/613,005

(22) Filed: Feb. 3, 2015

(65) Prior Publication Data

US 2016/0190075 A1 Jun. 30, 2016

Related U.S. Application Data

(60) Provisional application No. 62/098,034, filed on Dec. 30, 2014.

(51) Int. Cl.
*H01L 23/495* (2006.01)
*H01L 23/66* (2006.01)
*H01L 23/00* (2006.01)

(52) U.S. Cl.
CPC ......... *H01L 23/66* (2013.01); *H01L 23/49575* (2013.01); *H01L 24/09* (2013.01); *H01L 24/49* (2013.01); *H01L 24/85* (2013.01); *H01L 2224/48644* (2013.01); *H01L 2224/48647* (2013.01)

(58) Field of Classification Search
CPC . H01L 23/66; H01L 23/49575; H01L 24/09; H01L 24/49; H01L 24/85; H01L 2223/6605; H01L 2223/6611
USPC ........................................................ 257/676
See application file for complete search history.

(56) References Cited

U.S. PATENT DOCUMENTS

| | | | | |
|---|---|---|---|---|
| 5,828,957 A | * | 10/1998 | Kroeger | H04B 7/18545 370/320 |
| 6,863,548 B1 | | 3/2005 | Coccioli et al. | |
| 2002/0020555 A1 | | 2/2002 | Daido | |
| 2003/0127711 A1 | * | 7/2003 | Kawai | H01L 21/4842 257/666 |
| 2004/0104456 A1 | * | 6/2004 | Duffy | H01L 23/4952 257/666 |
| 2004/0141299 A1 | | 7/2004 | Huang et al. | |
| 2007/0284724 A1 | * | 12/2007 | Englekirk | H01L 23/66 257/692 |
| 2009/0195325 A1 | * | 8/2009 | Menon | H01L 23/66 333/32 |
| 2011/0051351 A1 | | 3/2011 | Harashima | |

OTHER PUBLICATIONS

Budka, T.P., 'Wide-bandwidth millimeter-wave bond-wire interconnects,' Microwave Theory and Techniques, IEEE Transactions on , vol. 49, No. 4, pp. 715,718, Apr. 2001.

* cited by examiner

*Primary Examiner* — Tu-Tu Ho
(74) *Attorney, Agent, or Firm* — Knobbe, Martens, Olson & Bear LLP (57) ABSTRACT

An integrated circuit can include a group of bond pads alternating between bond pads configured to provide a return path and bond pads configured to provide a signal bond pad. For example, five bond pads can be arranged in a return-signal-return-signal-return arrangement. The integrated circuit can further be configured to receive or transmit high frequency signals.

27 Claims, 8 Drawing Sheets

HIGH FREQUENCY INTEGRATED CIRCUIT AND PACKAGING FOR SAME

PRIORITY INFORMATION

This application claims the priority benefit under 35 U.S.C. §119(e) to the U.S. Patent Application No. 62/098,034, filed 30 Dec. 2014 and entitled "HIGH FREQUENCY INTEGRATED CIRCUIT AND PACKAGING FOR THE SAME." The entirety of said application is hereby expressly incorporated by reference herein.

BACKGROUND

1. Field

The present application relates to packaging for high frequency integrated circuits, more particularly to arrangements of signal and return line pads and bond wires, and integrated circuits including the same.

2. Description of the Related Art

High frequency processing is necessary in a variety of electronics applications, including (without limitation) up-converters, low-noise amplifiers, detectors, synthesizers, and other applications. It is desirable to improve signal transmission by reducing path losses. Further, it is desirable to improve the bandwidth for high frequency or wideband transmissions.

SUMMARY

For example, in one embodiment an integrated circuit package includes an integrated circuit having a circuit and a plurality of bond pads electronically connected to the circuit. The integrated circuit package also has a package structure including a plurality of leads connected to the plurality of the bond pads by a plurality of wire bonds. A group of five consecutive bond pads, of the plurality of bond pads connected to the leads, includes two signal bond pads and three return bond pads. One of these return bond pads is between the two signal bond pads, and the other two return bond pads are adjacent the two signal bond pads on opposite sides of the group.

In a further embodiment, an integrated circuit is configured for receiving and/or transmitting a high-frequency signal. The integrated circuit includes a group of five consecutive bond pads configured to communicate the high-frequency signals to or from the integrated circuit. Three of the bond pads are return path bond pads and two of the bond pads are signal bond pads configured to carry the same signal. The three return path bond pads and the two signal bond pads are arranged in a sequentially alternating configuration.

In a further embodiment, a method of assembling a printed circuit board is provided. An integrated circuit is mounted to a package structure. The integrated circuit includes a plurality of bond pads electronically connected to a radio frequency circuit. The plurality of bond pads includes a group of five consecutive bond pads, three of the consecutive bond pads being return bond pads and two of the consecutive bond pads being signal bond pads. The five consecutive return bond pads and the signal bond pads are arranged in a sequentially alternating configuration. Each of the group of five consecutive bond pads is wirebonded to a corresponding one of five consecutively positioned leads of the package structure.

In a further embodiment, an integrated circuit package includes an integrated circuit having a circuit and a plurality of bond pads electronically connected to the circuit. The integrated circuit package additionally includes a package structure including a plurality of leads connected to a plurality of the bond pads by a plurality of wire bonds. A group of three consecutive bond pads, of the plurality of bond pads connected to the leads, includes one signal bond pad and two return bond pads. The signal bond pad is between the two return bond pads, and the two return bond pads are configured to provide a return path only for signals carried on the signal bond pad.

BRIEF DESCRIPTION OF THE DRAWINGS

Further objects, features and advantages of the invention will become apparent from the following detailed description taken in conjunction with the accompanying figures showing illustrative embodiments of the invention, in which.

DETAILED DESCRIPTION OF PREFERRED EMBODIMENTS

Various present day electronics applications require high frequency signals to be transferred on and off packaged integrated circuits. These high frequency signals are sensitive to the physical form of the transmission connections. For example, thin bond wires present a relatively high inductance that can result in mismatches and lead to losses, particularly at high frequencies. As discussed herein, it may be beneficial to provide additional connections to improve signal transmission. Further, it may be beneficial to arrange these connections in particular ways to improve transmission properties, such as reducing inductance of the connections.

In some embodiments adding more return path connections can improve transmission properties. For example, providing more return or ground connections can provide different effects on the electromagnetic performance of individual wires. Such electromagnetic effects may be especially significant in specific situations, such as where high frequency or wideband signals will be applied. In such situations, it may be desirable to use additional signal and return lines (such as ground connections) to improve the performance of certain wires/connections. For example, placing multiple signal wires in parallel can reduce the total inductance. However, mutual inductances between the parallel wires can limit the benefits. Thus, as discussed further herein, it can be beneficial to include additional return/ground paths, and corresponding bond wires, and in some embodiments additional signal paths and corresponding bond wires, for transitioning high frequency signals between integrated circuits and packaging structures as illustrated herein and described below with respect to embodiments. It will be understood that "high frequency" is a relative term, and that the benefits of the arrangements taught herein depend in part upon the impedance of connections (e.g., bond wires) between IC bonds and package leads in relation to the system impedance, which in turn depends in part upon the physical dimensions of the connections and frequency of the signals, as well as the sensitivity of the system to mismatch.

Figure 1:
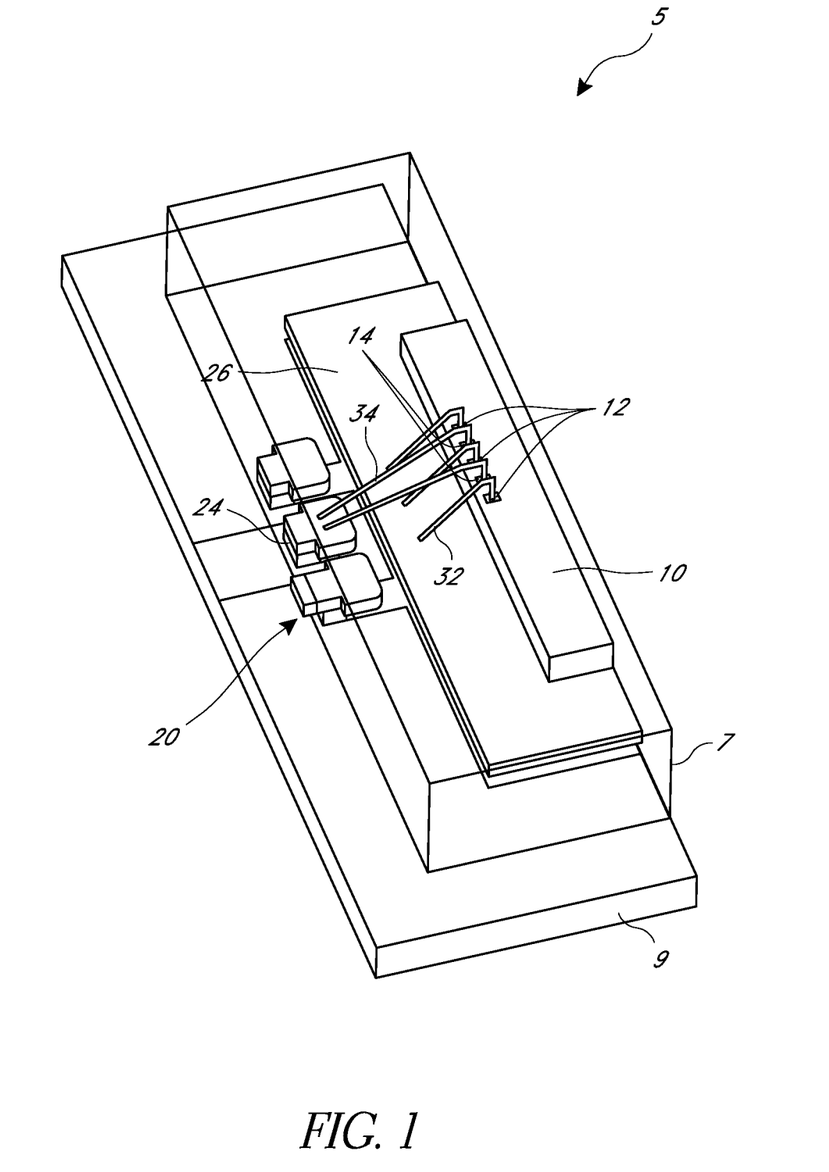
FIG. 1 depicts a perspective view of a portion of an embodiment of an integrated circuit package, including a single-ended integrated circuit connected to a lead frame where bond pads and wires are arranged in a ground-signal-ground-signal-ground (G-S-G-S-G) configuration.

FIG. 1 depicts a perspective view of a section of a package 5 including a section of an integrated circuit 10 mounted on a packaging structure. As depicted in FIG. 1, the packaging structure can be a lead frame 20 but other structures can also be used to physically and electrically connect the integrated circuit 10 to a system board 9. Examples of other packaging structures that connect an integrated circuit to a board include ceramic substrates, PCB substrates, or other structures. The lead frame 20 can include a plurality of leads, such as peripheral leads 24 and a die paddle 26, connected to an electrical path such as a ground. The leads 24 can be disposed along a perimeter of the package 5. The package 5 can also include an encapsulant 7 covering the lead frame 20, integrated circuit 10, and wire bonds 32, 34.

The integrated circuit 10 can provide one or more of a variety of analog or digital functions, potentially acting as a mixer, multiplier, down-converter, amplifier, synthesizer, detector, a combination of these functions, or provide other functions. In some embodiments, the integrated circuit can be configured to receive or transmit signals at a high frequency, such as above 1 GHz, particularly above 4 GHz, such as in the range of 20-60 GHz. These signals may be sensitive to electrical mismatches or other signal degradation that can be affected by the connections to the integrated circuit, such as between an integrated circuit and a lead frame. It will be understood that "high frequency" is a relative term, and that the benefits of the arrangements taught herein depend in part upon the impedance of connections (e.g., bond wires) between IC bonds and package leads in relation to the system impedance, which in turn depends in part upon the physical dimensions of the connections and frequency of the signals, as well as the sensitivity of the system to mismatch. Various combinations of these functions and capabilities can be provided on the integrated circuit 10. Further, although the integrated circuit 10 can include circuitry and associated bond pads for high frequency signal processing, the integrated circuit 10 can also include other circuitry and associated bond pads unrelated to high frequency signal or wideband processing and/or insensitive to the impedance of the bond wires. Thus, the circuitry and associated bond pads for high frequency or wideband signal processing may represent only a subset of circuits on the integrated circuit 10, and similarly be accessed by a subset of the die's bond pads, the package's pins/leads, and other connection elements.

As further shown in FIG. 1, the integrated circuit 10 can include a plurality of bond pads 12, 14 providing sites for connection to the lead frame 20 (or another packaging structure). In FIG. 1, only five consecutive bond pads 12, 14 are shown for simplicity. These bond pads 12, 14 can be used for particular purposes, such as for communicating high frequency signals on and off the integrated circuit 10. It will be understood that more than five consecutive bond pads can be used in other embodiments, and further that other bond pads (not shown) can connect to different circuitry in the integrated circuit 10. Further, as depicted the consecutive wires 32, 34 can be attached to the integrated circuit 10 at the consecutive bond pads 12, 14 by wire bonds (e.g., ball bonds, wedge bonds, compliant bonds, or other forms of bonds). The wires can be gold, copper, or other materials known in the art.

The wires 32, 34 in FIG. 1 are directed to one of two places. Three of the wires 32 connect to a die paddle 26 of the lead frame 20, and two of the wires 34 connect to a signal lead 24 of the lead frame. In the depicted embodiment, the die paddle 26 can be electrically connected to a return path for the signals, such as a ground connection, such that the wires 32 can act as ground wires. Thus, it will be understood that the bond pads 12 attached to the wires 32 connected to the paddle 26 can be ground bond pads. However, in other embodiments the ground wires 32 can connect to ground through other structures such as a ground lead on the lead frame (as further discussed below and depicted, for example, in FIG. 3), a plurality of paddles, or other components that can be connected to ground on a printed circuit board (PCB) or another grounding source. In either case, the multiple ground wires 32 can connect the integrated circuit 10 to ground in parallel.

While the term "ground" and shorthand form "G" are often used in the present description to describe various connections, it will be understood that the return paths for high frequency signals are not necessarily ground connections in other embodiments.

Similarly, the wires 34 can connect to a lead 24 that can provide or receive a signal to or from the integrated circuit 10, and thus the lead can be a signal lead, the wires thereto can be signal wires, and the bond pads 14 they connect to can be signal bond pads. Notably, in the depicted embodiment, the two signal wires 34 can connect to a single signal lead 24, thus carrying the same signal. However, in other embodiments the two signal wires 34 may connect to different signal leads and potentially carry different signals or combine to carry the same signal.

Further, as shown in FIG. 1, the consecutive ground wires 32 and the signal wires 34 are in a sequentially alternating configuration. Similarly, the consecutive ground bond pads 12 and signal bond pads 14 are in a corresponding sequentially alternating configuration. Although not shown here because the ground wires 32 connect to the paddle 26, in embodiments using separate ground leads, the ground leads and the signal lead(s) 24 can also be in a sequentially alternating configuration. With three ground features (bond pads, wires, and/or leads) and two signal features (bond pads, wires, and/or leads), the sequentially alternating configuration can be represented as a "G-S-G-S-G" set. For convenience, the terms "ground feature(s)" and "signal feature(s)" in the context of these sets can be used to describe any of bond pads, wires, leads, or other electronic components in the signal and return paths connecting an integrated circuit to packaging structures and from packaging structures to electronic systems, such as through the system board 9.

Other sequentially alternating configurations are possible. For example, in some embodiments a G-S-G set can be used, including two ground features and one signal feature. In further embodiments, a G-S-G-S-G-S-G set can be used (e.g., with seven ground/signal features), including four ground features and three signal features. Further embodiments can include sequentially alternating sets of 5 ground features and four signal features, 6 ground features and 5 signal features, 7 ground features and 6 signal features, etc. In some embodiments, it will be preferable to have ground features at the ends of the sets of bond pads, wires, and/or leads, such that in a sequentially alternating configuration there is one more ground feature than signal feature, and ground features are symmetrically located on the outer ends of the feature group.

In other embodiments, the sequentially alternating sets can have signals at the ends, such that there is one more signal than ground, such as: S-G-S, S-G-S-G-S, S-G-S-G-S-G-S, etc. Notably, when the sets are sequentially alternating and there is one more signal than ground (or one more ground than signal), the set can be symmetrical. However, in some embodiments the sequentially alternating sets can be asymmetric and have an equal number of signals and grounds, such that one end is a signal and the other is a ground, such as: S-G-S-G, S-G-S-G-S-G, S-G-S-G-S-G, etc.

The signals within the sets can be configured to carry high frequencies or other signal types as discussed herein, and transmission of these signal types can be improved in the sets, as discussed below. Further, on many integrated circuits 10, additional bond pads, wires, and/or leads can be disposed adjacent to the sets discussed above. Thus, for example, a set with ground features at the ends could be adjacent to signal features on both sides of the set. In some embodiments, the signal features within the set can be configured to transmit the same electronic signal, while signal features not in the set might transmit other signals.

As electronics get smaller and smaller, it becomes more difficult to increase the number of connections to components such as an integrated circuit. This often leads to a reduction in ground or signal return connections, as multiple ground connections may be viewed as redundant. However, in some embodiments it may be desirable to include more ground connections. Notably, placing a signal return (e.g., ground) wire next to a signal wire can improve transmission over the signal wire. For example, the ground and signal wires can create a mutual inductance that reduces the effective inductance of the pair of wires, as the two wires can have substantially opposite currents. The reduced effective inductance can reduce losses from the package transition mismatch introduced to a signal transmitted over the wires, particularly for high frequency signals, broadening the bandwidth.

Placing a signal return (e.g., ground) wire close to a signal wire can also add capacitance between the two wires. Accordingly, the connections between the signal and return path bond pads and their respective package leads (or grounded die pad) can be placed adjacent one another such that symmetrical adjacent signal and return paths act as a transmission line. Like a transmission line, the frequency bandwidth can be widened significantly and transition impedance can be better matched to the system impedance. Moreover, the symmetry can provide a consistent capacitance between lines that can reduce variation among connections. Thus, sequentially alternating sets including grounds at both ends can be particularly advantageous in some situations.

Placing ground features on both sides of the signal features can provide additional advantages. For example, this can provide a symmetric electrical design that reduces stray electromagnetic fields around the signals and grounds. Notably, such stray electromagnetic fields can introduce additional interference to the signals transmitted, particularly for high frequencies.

Symmetry and mutual inductance can also be improved by using two signal wires 34 from separate signal pads 14 connecting to one signal lead 24, as shown in FIG. 1. The two signal wires 34 carry the same signal in the illustrated embodiment. Further, the three ground wires 32 can optionally provide parallel connections from the integrated circuit 10 to the grounding paddle 26 (or other grounds). Thus, the G-S-G-S-G set can be symmetric in the arrangement of its physical connections, and also provide symmetric electrical signals ("electrically symmetric"). Notably, these advantages of symmetry can also be present in alternating configurations with signal features at opposite ends (and one more signal than ground). Sets with an equal number of signal features and ground features (e.g., G-S-G-S-G-S) can be considered "partially-symmetric," particularly when the each signal feature transmits the same electronic signal, even though the set is not fully symmetric. Such configurations can provide unique trade-offs between clean transmission and economy of bond pads.

Even further, symmetry can be further improved by making the various wires, leads, bond pads, and other features substantially physically symmetric. For example, in a G-S-G-S-G set, symmetry is provided by the sequentially alternating signal and ground features. However, if some of the ground or signal features have different physical shapes, sizes, material properties, etc., then symmetry may be reduced as the electromagnetic effects from these features may vary. Thus, in some embodiments the sets can be substantially physically symmetric to further improve transmission.

Figure 2A:
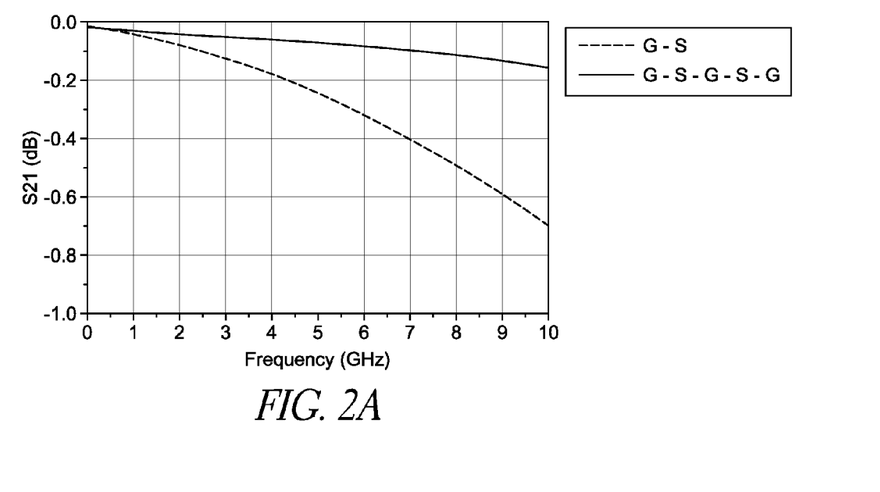
FIG. 2A depicts an embodiment relationship between frequency and forward signal transmission gain of an integrated circuit connected to a lead frame with a G-S-G-S-G configuration and a nominal G-S configuration.
Figure 2B:
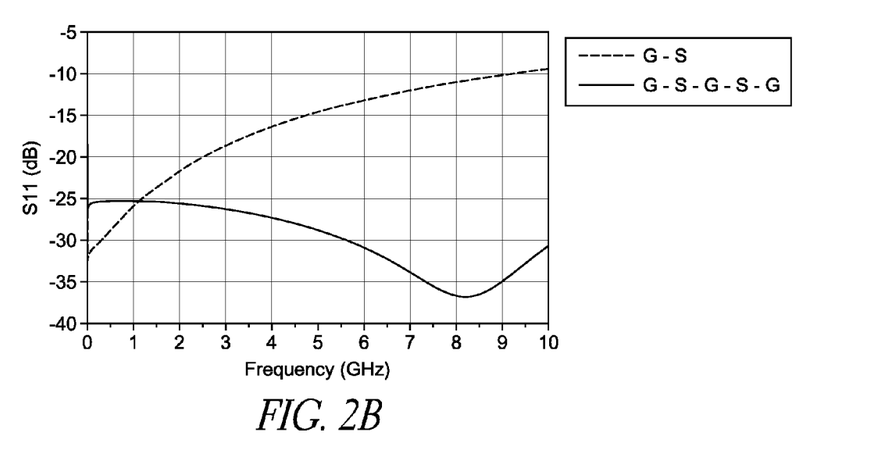
FIG. 2B depicts an embodiment relationship between frequency and reflection coefficient of an integrated circuit connected to a lead frame with a G-S-G-S-G configuration and a nominal G-S configuration.

FIGS. 2A and 2B depict potential advantages of the G-S-G-S-G configuration compared to a G-S configuration. FIG. 2A depicts modeled relationships between frequency and signal transmission gain (S21) of integrated circuit packages having bond pad and bond wire groups in a G-S-G-S-G configuration compared to a G-S configuration. As shown, the gain declines with frequency substantially faster on the G-S set compared to the G-S-G-S-G set. FIG. 2B depicts similar data for the reflection (S11), particularly above approximately 4 GHz. As shown, the reflection increases substantially faster for the G-S set compared to the G-S-G-S-G set, particularly above approximately 4 GHz. Thus, the sequentially alternating ground and signal configurations appear to provide significant value at higher frequencies. In some embodiments, the alternating sets described herein can be used with integrated circuits configured to receive or transmit signals at or above approximately 4 GHz, and particularly at or above approximately 10 GHz, 20 GHz, 40 GHz or beyond.

Figure 3A:
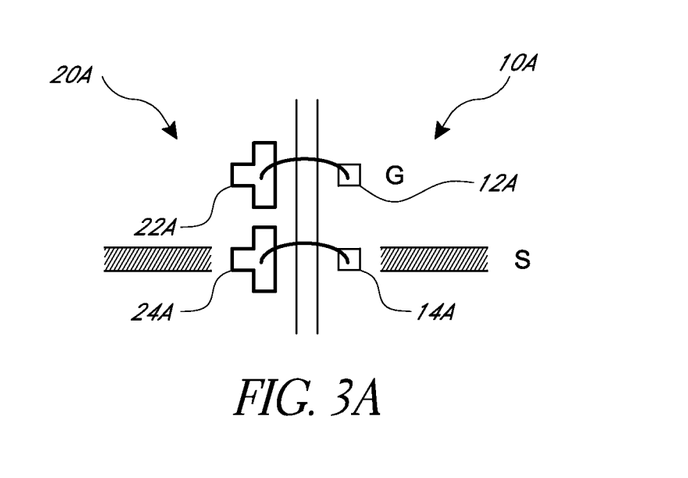
FIG. 3A depicts a plan view of connections between a die and a package in a ground-signal (G-S) configuration.

FIGS. 3A-3I depict different arrangements for sets of connections between an integrated circuit 10 and a packaging structure 20 (e.g., a lead frame) where similar features are referenced by similar reference numbers. In FIG. 3A, an S-G set is depicted, including one signal connection and one return connection between a section of the integrated circuit 10A and a section of the packaging structure 20A. The signal connection, labeled "S," can include a signal bond pad 14A connected by a wire to a signal lead 24A. The return connection, labeled "G" (e.g., for "ground"), can include a ground bond pad 12A connected by a wire to a ground lead 22A. When the return connection serves as a general ground connection, additional electronic connections can attach to it. In FIGS. 3A-3I, the illustrated wires connecting the leads and bond pads are not labelled, to simplify the figures.

Figure 3B:
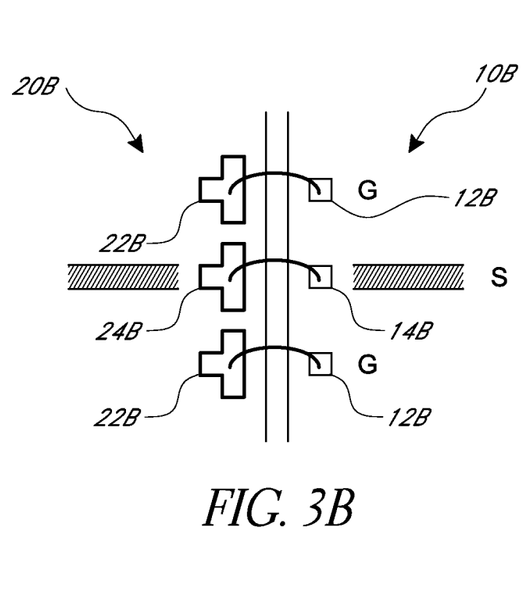
FIG. 3B depicts a plan view of connections between a die and a package in a ground-signal-ground (G-S-G) configuration in accordance with an embodiment.

In FIG. 3B, a G-S-G set includes one signal connection and two return connections, sequentially alternating. Thus, the signal connection is surrounded by two return connections. The return connections can include a wire connection between ground bond pads 12B and ground leads 22B. The signal connection can include a wire connection between a signal bond pad 14B and a signal lead 24B. In some embodiments, the return connections can carry substantially the same transmissions, for example by being connected in parallel, such that the G-S-G set is electrically symmetric.

Figure 3C:
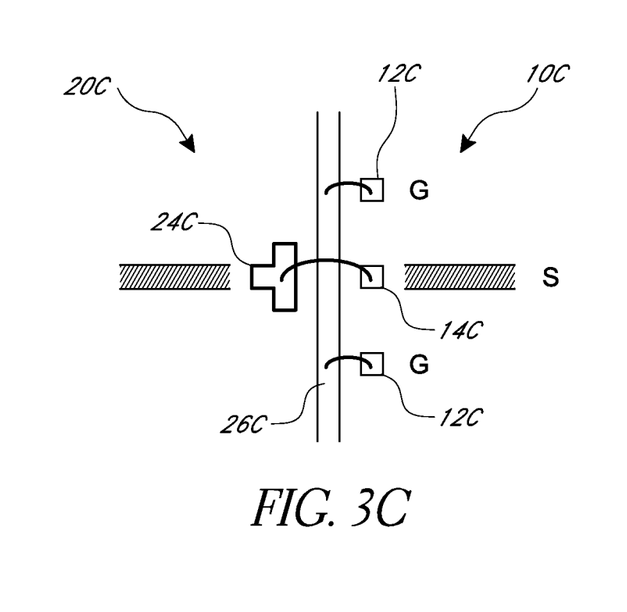
FIG. 3C depicts a plan view of connections between a die and a package in a ground-signal-ground (G-S-G) configuration in accordance with another embodiment.
Figure 3D:
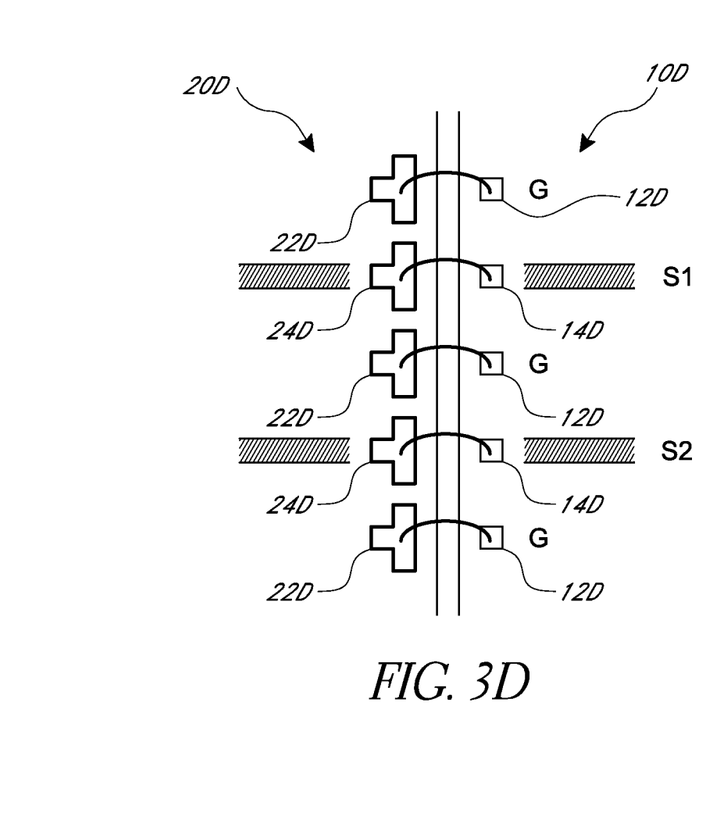
FIG. 3D depicts a plan view of connections between a die and a package in a ground-signal-ground-signal-ground (G-S-G-S-G) configuration in accordance with another embodiment.
Figure 3E:
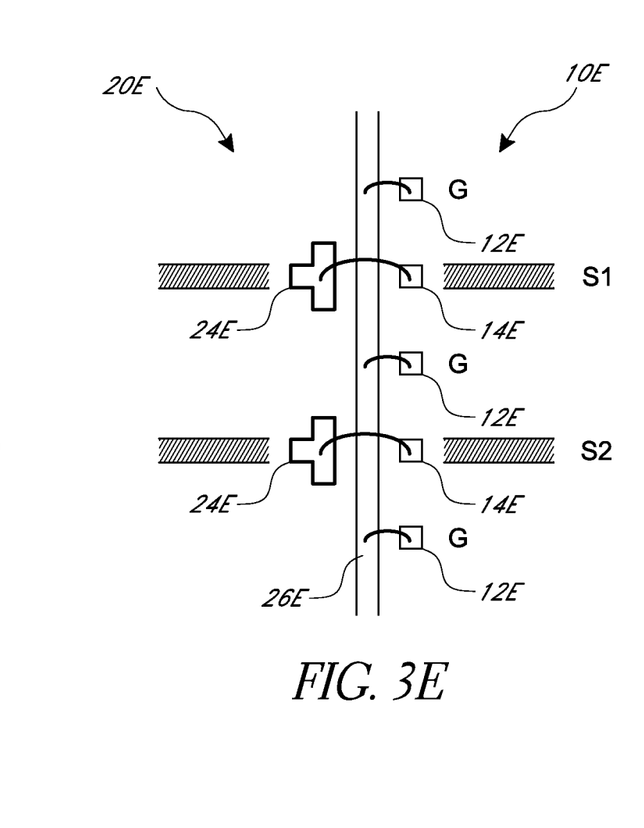
FIG. 3E depicts a plan view of connections between a die and a package in a ground-signal-ground-signal-ground (G-S-G-S-G) configuration in accordance with another embodiment.

In FIG. 3C, a G-S-G set is depicted that can be substantially similar to the set depicted in FIG. 3B. However, the set in FIG. 3C can include downbonds, such as return connections between the ground bond pads 12C and a paddle 26C. The paddle 26C can provide a ground/return connection similar to that discussed regarding FIG. 1. In other embodiments, such a general ground/return connection can be provided by other conducting elements on a package structure 20C or other structure.

Notably, in some embodiments the wires from the ground bond pads 12C to the paddle 26C might not provide as much improvement in transmission properties as a connection to a ground lead. For example, in some embodiments these wires might not be coextensive with the length of the signal wires. In such situations, they can still provide some improvement in transmission properties without occupying scarce leads. In other embodiments, the ground (or return) wires can be coextensive with the signal wires, or even extend farther than the signal wires.

FIGS. 3D-3I depict G-S-G-S-G sets that are substantially similar to the sets depicted in FIGS. 3B-3C. For example, each figure includes sequentially alternating signal and return connections, with return connections connecting to either ground leads 24 or common, centrally grounded features, such as a grounded paddle 26. As discussed above, the multiple return connections can provide a return path for only one signal, or can provide a return path for multiple signals. For example, in FIGS. 3D and 3E, the return uppermost return connections might provide a return specific to signal line S1, and the lowermost return connection might provide a return specific to signal line S2, such that the return connections are specific to an adjacent signal connection. Return connections adjacent two signal connections (such as the central signal connection) can provide a return connection specific to either S1 or S2, both S1 and S2, or provide a general ground connection for other transmissions (including S1 and/or S2).

The connections in FIGS. 3D-3I can be symmetric, in that they include a G-S-G-S-G configuration (in other words, symmetric with respect to signals and grounds). The connections can also be electrically asymmetric. For example, in FIGS. 3D and 3E, the signal lines S1 and S2 can be configured to carry different signals, such that the electrical transmissions can be asymmetric. In FIGS. 3F-3I, the two signal connections can carry the same electronic signal, such that the set can be electrically symmetric.

Figure 3F:
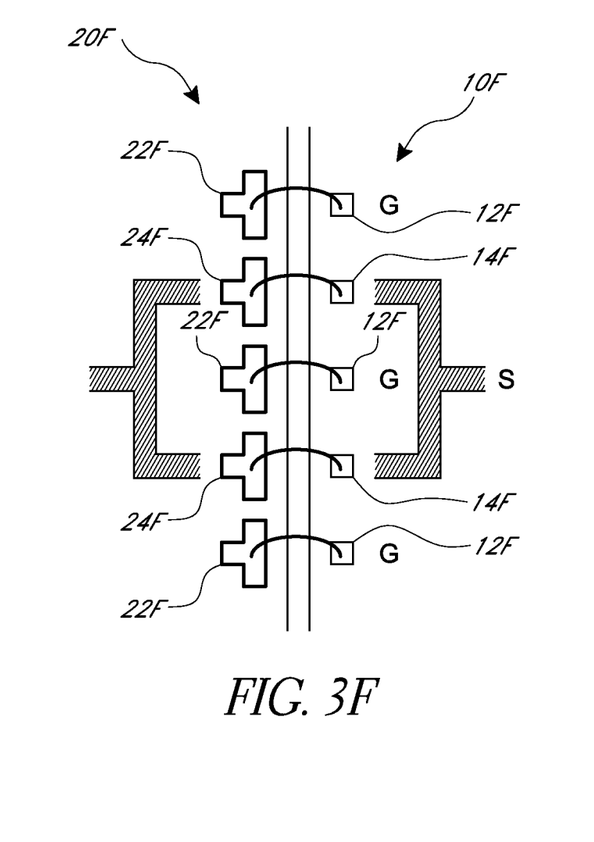
FIG. 3F depicts a plan view of connections between a die and a package in a ground-signal-ground-signal-ground (G-S-G-S-G) configuration in accordance with another embodiment.
Figure 3G:
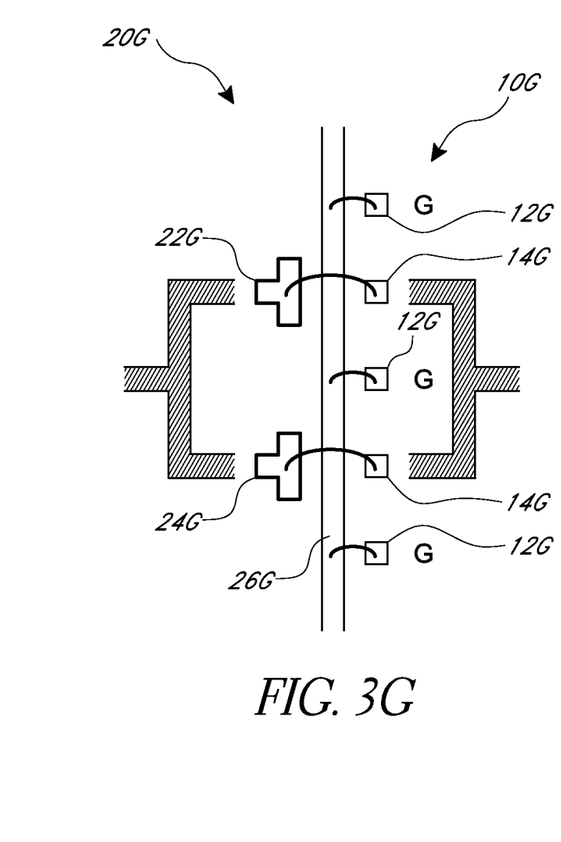
FIG. 3G depicts a plan view of connections between a die and a package in a ground-signal-ground-signal-ground (G-S-G-S-G) configuration in accordance with another embodiment.
Figure 3H:
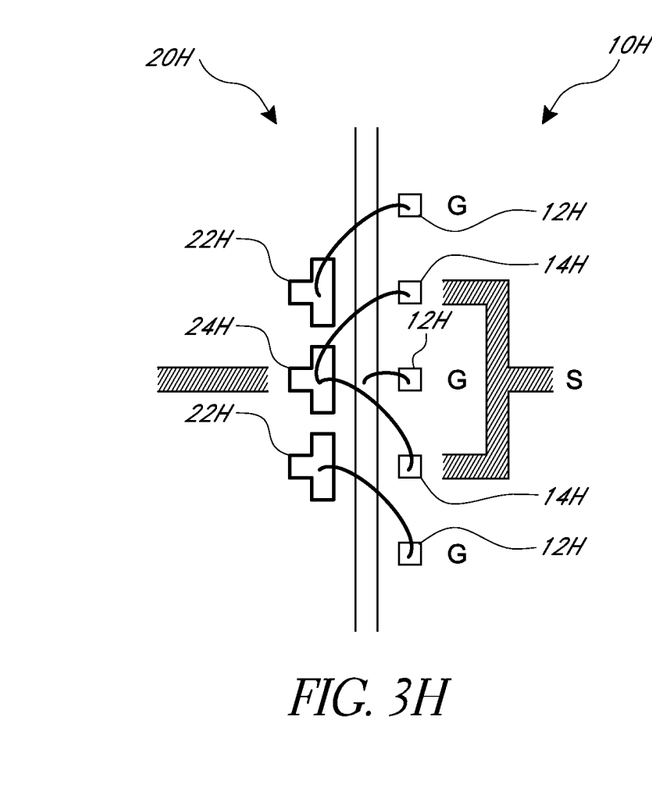
FIG. 3H depicts a plan view of connections between a die and a package in a ground-signal-ground-signal-ground (G-S-G-S-G) configuration in accordance with another embodiment.
Figure 3I:
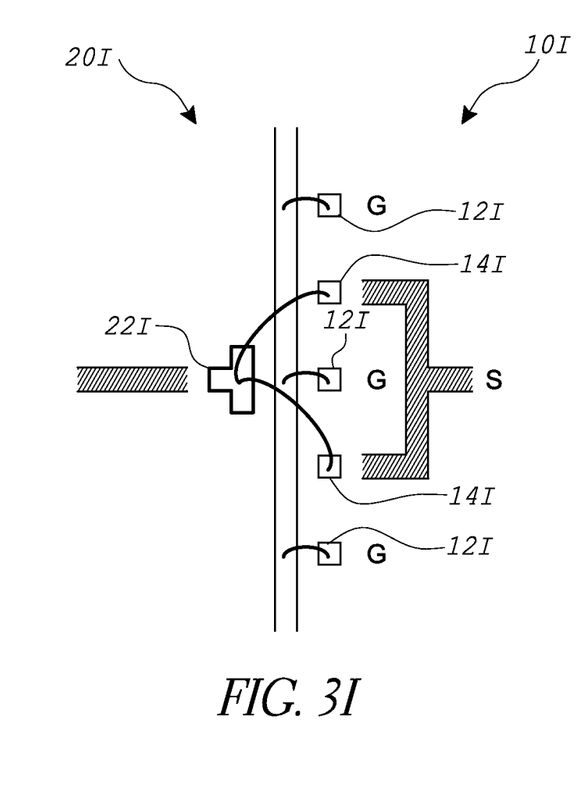
FIG. 3I depicts a plan view of connections between a die and a package in a ground-signal-ground-signal-ground (G-S-G-S-G) configuration in accordance with another embodiment.

The connections in FIGS. 3F-3I can differ in how the single signal is passed through two signal connections. As shown in FIGS. 3F and 3G, a single electric signal can be transmitted through two sets of signal bond pads 14F or 14G and signal leads 24F or 24G. The signal can be split into two separate parallel signal connections within the integrated circuit 10F or 10G and similarly for connections between the package structure 20F or 20G and the system board or other external signal carrier. As shown in FIGS. 3H and 3I, they can also split into parallel connections at the interface between the package structure 20H or 20I and the integrated circuit 10H or 10I. As shown, one signal lead 24H or 24I can connect to two bond pads 14H or 14I. Thus, the package leads can have a G-S-G configuration or an S configuration, while the corresponding bond pads can have a G-S-G-S-G configuration. Notably, symmetry can still be preserved in these arrangements, as discussed in other embodiments. Further, in other embodiments multiple signal leads can connect to a single signal bond pad in the integrated circuit, as a reverse of the embodiments depicted in FIGS. 3H, 3I.

Figure 4:
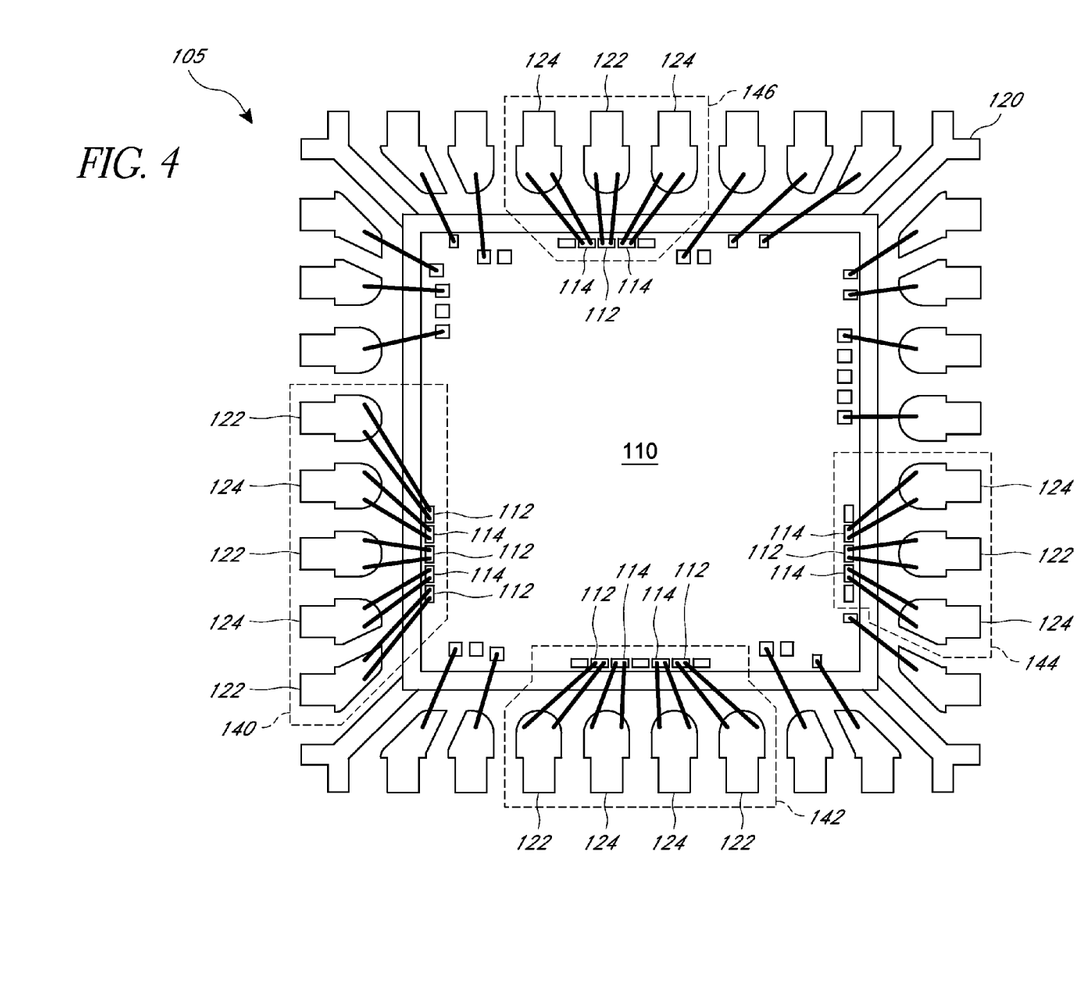
FIG. 4 depicts a plan view of a differential embodiment integrated circuit connected to a lead frame, in accordance with an embodiment.

FIG. 4 depicts a package 105 comprising an integrated circuit 110 mounted to a packaging structure in the form of a lead frame 120, including a variety of groups of integrated circuit bond pads and package leads for different circuits within the integrated circuit 110. As discussed in other embodiments herein, in a packaging process, the bond pads 112, 114 on the integrated circuit 110 can be wire bonded to the package structure after the integrated circuit 110 is mounted on the packaging structure.

Section 140 depicts a group of bond pads 112, 114, leads 122, 124, and bond wires for circuits such as a high frequency circuit where high signal quality is important, in accordance with an embodiment. The symmetric return and signal alternation for package leads, bond wires, and/or integrated circuit bond pads and internal integrated circuit connections as taught herein are particularly advantageous for transmitting high frequency or wideband signals between package leads and integrated circuits. Frequency ranges that benefit most from these features can depend on the form of these features, such as the length of the wires, the size of the bond pads and leads, and other characteristics. For example, the section 140 can provide reception and/or transmission of radio frequency (RF) signals (for example, approximately 4 GHz to approximately 40 GHz or higher). Examples of corresponding circuits within the integrated circuit 110 include an up-converter (transmitting, for example, at or above approximately 4 GHz), an RF amplifier, detector, synthesizer, and other wideband applications discussed herein. As shown, in section 140 a G-S-G-S-G set is provided with both the ground (or other return path) bond pads 112 and signal bond pads 114, and corresponding ground (or other return path) leads 122 and signal leads 124 (along with corresponding bond wires in solid black lines, not numbered in the figure). Further, as shown, there can be two wires connected in parallel between each bond pad-lead pair. Using two wires between each bond pad-lead pair can further reduce inductance, in addition to the inductance reduction from the symmetrical ground-signal alternation. The bond pads 112, 114 electrically connect to high frequency processing circuitry within the integrated circuit 110.

Section 142 depicts a group of connections for applications such as reception and/or transmission of baseband and IQ (in-phase and quadrature) modulation signals, in accordance with an embodiment. In the depicted example only signal leads 124 are provided for the circuit on the package structure. A G-S-_-S-G pattern of ground and signal bond pads 112, 114 are used, forming a partially-alternating symmetrical set with a dummy bond pad in the middle. The bond pads 112, 114 can connect to leads 122, 124 in a partially-alternating G-S-S-G configuration. In this partially-alternating, symmetric set, each signal feature can be adjacent only one ground feature, providing some of the benefits described herein, but not necessarily as much improved transmission properties as a signal feature adjacent two ground features. Notably, this configuration can also still provide physical symmetry to minimize losses from reflections. Further, in some embodiments, electrical symmetry can also be provided by receiving/transmitting a common signal over both signal connections, and having the corresponding grounds connections carrying the same returns.

Sections 144 and 146 depict groups of connections for applications such as reception and/or transmission of intermediate frequency (IF) signals and local oscillator (LO) signals, respectively, in accordance with embodiments. In both sections, the leads 122, 124 and bond pads 112, 114 can have an S-G-S configuration, forming an alternating set with signals at the ends.

As shown in the embodiment in FIG. 4, a variety of groups of connections and arrangements of signal and return (e.g., ground) features can be provided within a package for the same integrated circuit. In particular, for quality-sensitive and high frequency applications an alternating symmetrical arrangement of bond pads, or bond pads and corresponding package leads, such as the G-S-G-S-G configuration in section 140 can be advantageous. For such sensitive and high frequency signal processing, redundant ground leads 122 represent a sacrifice in available leads in the package in order to maintain high signal quality. Examples of such circuits for which signal quality should be maintained with minimal losses in the course of receiving or transmitting high frequency signals include, for example, mixers, frequency multipliers, RF amplifiers, RF detectors, and RF synthesizers In contrast, other groups of features can communicate with circuits which do not receive or transmit high frequency signals (such as baseband and IQ modulators or IF circuits) or high frequency circuits for whom the quality of the signals is not critical (such as local oscillators). For such circuits, package leads often need not be sacrificed for redundant ground connections.

As shown in the IQ section 142, semi-alternating bond pads and leads can be used with signals in a group of two alternating with grounds. Further, as shown in that section 142, a dummy bond pad can be provided between two signals, instead of an additional ground/return connection. As shown in the IF and LO sections 144, 146, a S-G-S set of leads and bond pads can be used. Further, as shown in the embodiment of FIG. 4, multiple wires can connect one bond pad to one lead. Similarly, as shown in FIG. 1, two bond pads can be connected to one lead.

The various configurations described herein have particular benefits for circuits and signals sensitive to impedance mismatch, particularly those operating at high enough frequency that the transition impedance is significant (e.g. greater than 10%) compared to the system impedance. For example, a 1 mm bond wire could have an inductance of approximately 1 nH. Because reactance is proportionate to the signal frequency (reactance=$2\pi$(frequency)(inductance)), the relative impedance of the bond wire in transitioning signals between IC and board will differ with signal frequency. If a 1 GHz signal is passed through the wire, the expected reactance would be approximately j6 ohms. If the system has an impedance of 50 ohms, the wire's impedance is slightly over 10% of the system impedance, and can thus begin to degrade the signal transmission. The embodiments described herein can reduce transition impedance between the bond pads and the leads to be less than about 10% of the system impedance for signals that are sensitive to impedance mismatch (e.g., input to a low-noise amplifier).

The methods, systems, and/or apparatus described above can be implemented in integrated circuits and into various electronic devices. For example, the integrated circuit, or the integrated circuit attached to a package structure (such as a lead frame), can be physically and electronically attached to a printed circuit board (PCB). Examples of the electronic devices can include, but are not limited to, automotive parts, consumer electronic products, parts of the consumer electronic products, electronic test equipment, etc. Examples of integrated circuits within electronic products can include amplifiers, rectifiers, programmable filters, attenuators, variable frequency circuits, etc. Examples of the electronic devices can also include memory chips, memory modules, circuits of optical networks or other communication networks, and disk driver circuits. The electronic products can include, but are not limited to, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language does not imply that features, elements and/or states are in any way required for one or more embodiments or that one or more embodiments necessarily include logic for deciding, with or without author input or prompting, whether these features, elements and/or states are included or are to be performed in any particular embodiment.

The teachings provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present disclosure is defined only by reference to the appended claims.

What is claimed is:

1. An integrated circuit package comprising:
    an integrated circuit comprising a circuit and a plurality of bond pads electronically connected to the circuit; and
    a package structure comprising a plurality of leads connected to a plurality of the bond pads by a plurality of wire bonds,
    wherein a group of five consecutive bond pads of the plurality of bond pads connected to the leads comprise two signal bond pads configured to transmit the same signal and three return bond pads, one return bond pad being between the two signal bond pads and the other two return bond pads being adjacent the two signal bond pads on opposite sides of the group.

2. The integrated circuit package of claim 1, wherein the plurality of leads comprise at least one die paddle.

3. The integrated circuit package of claim 1, wherein the package structure comprises a lead frame.

4. The integrated circuit package of claim 3, wherein the lead frame comprises a group of five consecutive leads connected to the group of five consecutive bond pads by wire bonds.

5. The integrated circuit package of claim 4, wherein each of the five consecutive bond pads is connected to one of the five consecutive leads by at least two wire bonds.

6. The integrated circuit package of claim 1, wherein the at least two signal bond pads and at least three ground bond pads are arranged to be physically symmetric.

7. The integrated circuit package of claim 1, wherein the at least two signal bond pads and at least three ground bond pads are in sufficiently close physical proximity to provide mutual negative inductance.

8. The integrated circuit package of claim 1, wherein the circuit is configured to transmit or receive signals with a frequency of greater than or equal to about 1 GHz through the two signal bond pads.

9. The integrated circuit package of claim 1, wherein the circuit is configured to transmit or receive signals with a frequency greater than or equal to about 4 GHz.

10. The integrated circuit package of claim 1, wherein the group of five consecutive bond pads is part of a group of seven consecutive bond pads further comprising one additional signal bond pad on each side of the group of five consecutive bond pads.

11. The integrated circuit package of claim 1, wherein the group of three consecutive bond pads are in sufficiently close physical proximity to provide mutual negative inductance.

12. The integrated circuit package of claim 1, wherein the circuit is configured to transmit or receive signals with a frequency of greater than or equal to about 1 GHz through the signal bond pad and impedance for the transition between the bond pads and the leads is less than 10% of system impedance for the circuit.

13. An integrated circuit configured for receiving and/or transmitting a high-frequency signal, the integrated circuit comprising:
    a group of five consecutive bond pads configured to communicate the high-frequency signals to or from the integrated circuit, three of the bond pads being return path bond pads and two of the bond pads being signal bond pads configured to carry the same signal,
    wherein the three return path bond pads and the two signal bond pads are arranged in a sequentially alternating configuration.

14. The integrated circuit of claim 13, wherein the three return path bond pads and two signal bond pads are all disposed on a single side of the integrated circuit.

15. The integrated circuit of claim 13, wherein the two signal bond pads are configured to carry an analog signal.

16. The integrated circuit of claim 13, wherein the two signal bond pads are configured to carry a digital signal.

17. The integrated circuit of claim 13, wherein the integrated circuit comprises at least one of an RF up-converter, RF down-converter, RF amplifier, frequency multiplier, RF synthesizer, and RF detector circuit.

18. The integrated circuit of claim 13, wherein the integrated circuit is configured to receive or transmit signals of at least 1 GHz through the two signal bond pads.

19. The integrated circuit of claim 13, wherein the integrated circuit is configured to receive or transmit signals of at least 10 GHz through the two signal bond pads.

20. A package comprising the integrated circuit of claim 13, further comprising a lead frame connected to the integrated circuit by a plurality of wire bonds such that the five consecutive bond pads are connected by wires to five consecutive leads of the lead frame.

21. A system comprising the package of claim 20 mounted on a printed circuit board.

22. A method of assembling a printed circuit board comprising:
    mounting an integrated circuit to a package structure, the integrated circuit comprising a plurality of bond pads electronically connected to a radio frequency circuit, the plurality of bond pads comprising a group of five consecutive bond pads, three of the consecutive bond pads being return bond pads and two of the consecutive bond pads being signal bond pads configured to transmit the same signal, the five consecutive return bond pads and the signal bond pads being arranged in a sequentially alternating configuration; and
    wirebonding each of the group of five consecutive bond pads to a corresponding one of consecutively positioned leads of the package structure.

23. An integrated circuit package comprising:
    an integrated circuit comprising a circuit and a plurality of bond pads electronically connected to the circuit; and a package structure comprising a plurality of leads connected to a plurality of the bond pads by a plurality of wire bonds, wherein a group of three consecutive bond pads of the plurality of bond pads connected to the leads comprise one signal bond pad and two return bond pads, the signal bond pad being between the two return bond pads, the two return bond pads configured to provide a return path only for signals carried on the signal bond pad, wherein the circuit is configured to transmit or receive signals with a frequency of greater than or equal to about 1 GHz through the signal bond pad and impedance for the transition between the bond pads and the leads is less than 10% of system impedance for the circuit.

24. The integrated circuit package of claim 23, wherein the plurality of leads comprise at least one paddle.

25. The integrated circuit package of claim 23, wherein the package structure comprises a lead frame.

26. The integrated circuit package of claim 25, wherein the lead frame comprises a group of three consecutive peripheral leads connected to the group of three consecutive bond pads by wire bonds.

27. The integrated circuit package of claim 23, wherein the circuit is configured to transmit or receive signals with a frequency greater than or equal to about 20 GHz.

* * * * *